United States Patent
Toda et al.

(10) Patent No.: US 9,646,848 B2
(45) Date of Patent: May 9, 2017

(54) ETCHING METHOD, ETCHING APPARATUS AND STORAGE MEDIUM

(71) Applicant: Tokyo Electron Limited, Tokyo (JP)

(72) Inventors: Satoshi Toda, Yamanashi (JP); Kensaku Narushima, Yamanashi (JP); Hiroyuki Takahashi, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/789,674

(22) Filed: Jul. 1, 2015

(65) Prior Publication Data
US 2016/0005621 A1    Jan. 7, 2016

(30) Foreign Application Priority Data
Jul. 1, 2014    (JP) ................. 2014-136114

(51) Int. Cl.
*H01L 21/311* (2006.01)
*H01L 21/67* (2006.01)

(52) U.S. Cl.
CPC ... *H01L 21/31116* (2013.01); *H01L 21/31111* (2013.01); *H01L 21/67069* (2013.01); *H01L 21/67109* (2013.01)

(58) Field of Classification Search
CPC ................. H01L 21/31111; H01L 21/02164
See application file for complete search history.

(56) References Cited

U.S. PATENT DOCUMENTS

| 8,058,179 | B1* | 11/2011 | Draeger | H01L 21/02164 |
| | | | | 156/345.26 |
| 2009/0191340 | A1 | 7/2009 | Tozawa | |
| 2015/0214101 | A1* | 7/2015 | Ren | H01L 21/3065 |
| | | | | 438/704 |
| 2016/0035581 | A1* | 2/2016 | Posseme | H01L 21/306 |
| | | | | 438/705 |

FOREIGN PATENT DOCUMENTS

JP    2009-158774    7/2009

* cited by examiner

*Primary Examiner* — Duy Deo (57) ABSTRACT

A method for etching a silicon oxide film on a target substrate where an etching area is partitioned by pattern layers and stopping the etching before a base layer of the silicon oxide layer is etched is disclosed. The method includes heating the target substrate in a vacuum atmosphere and intermittently supplying, as an etching gas, at least one of a processing gas containing a hydrogen fluoride gas and an ammonia gas in a pre-mixed state and a processing gas containing a compound of nitrogen, hydrogen and fluorine to the target substrate from a gas supply unit multiple times.

5 Claims, 13 Drawing Sheets

FIG.17
*(RELATED ART)*

ETCHING METHOD, ETCHING APPARATUS AND STORAGE MEDIUM

CROSS REFERENCE

This application claims priority to and benefit of Japanese Patent Application No. 2014-136114, filed on Jul. 1, 2014, the entire content of which is herein incorporated by reference for all purposes.

FIELD OF THE INVENTION

The disclosure relates to a technique for performing an etching process by supplying a processing gas to a surface of a target substrate.

BACKGROUND OF THE INVENTION

As types of semiconductor devices are increased, it is required to deal with various new processes in a semiconductor manufacturing field. For example, there is a process of etching a $SiO_2$ (silicon oxide) layer where silicon walls as pattern layers are arranged in parallel at a regular interval and an etching area is partitioned by the silicon walls and then stopping the etching in the middle of the $SiO_2$ layer.

As for a method for etching a $SiO_2$ layer, there is known a method disclosed in, e.g., Japanese Patent Application Publication No. 2009-158774, which performs a chemical oxide removal process using HF (hydrogen fluoride) gas and $NH_3$ (ammonia) gas. In this method, HF gas and $NH_3$ gas are supplied to a processing chamber while heating a semiconductor wafer (hereinafter, referred to as "wafer") in order to etch the $SiO_2$ layer formed on a surface of the wafer. The gases react with $SiO_2$, thereby generating $(NH_4)_2SiF_6$ (ammonium silicofluoride). $SiO_2$ is removed by sublimating $(NH_4)_2SiF_6$ by heating.

In the case of performing the process of stopping the etching of the $SiO_2$ layer in the middle of the $SiO_2$ layer, it is required to ensure good roughness of the surface of the $SiO_2$ layer after the etching. In the case of etching the $SiO_2$ layer along the pattern layers as in the above example, it is required to suppress microloading in which an etching speed varies depending on a density of the pattern.

SUMMARY OF THE INVENTION

In view of the above, the disclosure provides a technique capable of improving roughness and suppressing microloading in etching a $SiO_2$ layer where an etching area is partitioned by pattern layers and stopping the etching before a base layer is etched.

A method for etching a silicon oxide film on a target substrate where an etching area is partitioned by a pattern layer and stopping the etching before a base layer of the silicon oxide film is etched comprises heating the target substrate in a vacuum atmosphere and intermittently supplying, as an etching gas, at least one of a first processing gas containing a hydrogen fluoride gas and an ammonia gas in a pre-mixed state and a second processing gas containing a compound of nitrogen, hydrogen and fluorine to the target substrate from a gas supply unit in multiple cycles.

A substrate processing apparatus comprises a processing chamber having a mounting part configured to mount thereon the target substrate, a gas supply unit, having a plurality of gas supply holes facing the target substrate, configured to supply, as an etching gas, at least one of a processing gas containing a hydrogen fluoride gas and an ammonia gas in a pre-mixed state and a processing gas containing a compound of nitrogen, hydrogen and fluorine to the target substrate mounted on the mounting part, a vacuum exhaust unit configured to evacuate the processing chamber, and a control unit configured to output a control signal that controls the gas supply unit to intermittently supply the etching gas to the target substrate from the gas supply unit in multiple cycles.

BRIEF DESCRIPTION OF THE DRAWINGS

The objects and features of the disclosure will become apparent from the following description of embodiments, given in conjunction with the accompanying drawings, in which.

DETAILED DESCRIPTION OF THE EMBODIMENTS

Figure 1:
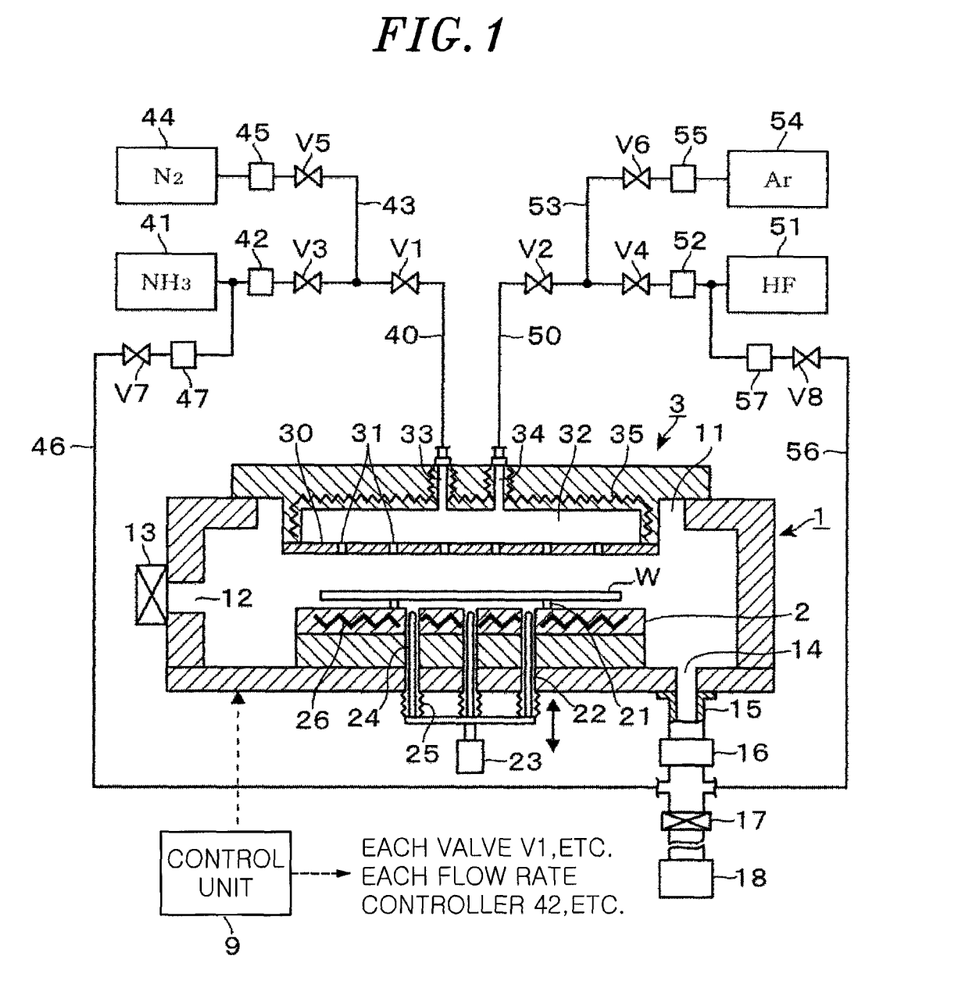
FIG. 1 is a vertical cross sectional view showing an etching apparatus according to an embodiment.

Hereinafter, an etching apparatus according to an embodiment will be described. As shown in FIG. 1, an etching apparatus includes a processing chamber 1 configured as a vacuum chamber having an approximately cylindrical shape as a horizontal cross sectional shape. Provided at a side wall of the processing chamber 1 is a loading/unloading port 12 through which a target substrate, e.g., a wafer W having a diameter of 300 mm, is transferred. A gate valve 13 for opening/closing the loading/unloading port 12 is provided at the loading/unloading port 12.

A cylindrical stage 2 for mounting thereon a wafer W is provided in the processing chamber 1. Seven supporting pins 21 for supporting the wafer W protrude from the top surface of the stage 2 with a gap of, e.g., about 0.3 mm, from the surface of the stage 2 along a circumferential direction of the stage 2. Three through holes 22 spaced from each other at a regular interval along the circumferential direction are formed through the stage 2 and a bottom wall of the processing chamber 1. Up thrust pins 24 for transferring a wafer W are provided in the through holes 22 to protrude and retreat with respect to the upper surface of the stage 2 by an elevation unit 23. A lower part of each of the upthrust pins 24 is covered by a bellows 25 for sealing the processing chamber 1. A heater 26 serving as a heating unit is provided in the stage 2, so that the wafer W mounted on the stage 2 is heated to a set temperature.

A gas exhaust port 14 is provided at a bottom surface of the processing chamber 1. A gas exhaust line 15 is connected to the gas exhaust port 14 and also connected to a vacuum pump 18 serving as a vacuum exhaust mechanism via a pressure control valve 16 and an opening/closing valve 17. The pressure control valve 16 and the opening/closing valve 17 are installed in that order from the gas exhaust port 14 side. The components such as the gas exhaust line 15 and the like form a vacuum exhaust unit.

An opening 11 is formed at the top surface of the processing chamber 1. A gas supply unit 3 is provided to block the opening 11. A diffusion plate 30 is provided at the gas supply unit 3 to face a mounting surface of the stage 2. The diffusion plate 30 is formed in a circular plate shape and made of a material having a high thermal conductivity, such as aluminum or the like. Further, the diffusion plate 30 is configured as a punching plate having a plurality of gas supply holes 31, each having a diameter ranging from about 0.5 mm to 2.0 mm, penetrating therethrough in a thickness direction. The gas supply holes 31 are arranged in a matrix pattern. Formed above the diffusion plate 30 is a dispersion space 32 for a processing gas supplied into the processing chamber 1.

The gas supply unit 3 has two gas supply lines 33 and 34 communicating with the dispersion space 32. A downstream end of an $NH_3$ gas supply line 40 is connected to an upper end of the gas supply line 33. A downstream end of an HF gas supply line 50 is connected to an upper end of the gas supply line 34. First, the $NH_3$ gas supply line 40 side ($NH_3$ gas supply system) will be described. An $NH_3$ gas supply source 41, a flow rate control unit 42, and valves V3 and V1 are installed in the $NH_3$ gas supply line 40 in that order from an upstream side thereof. A downstream end of an $N_2$ (nitrogen) gas supply line 43 for supplying a carrier gas (dilution gas) is connected between the valves V3 and V1 in the $NH_3$ gas supply line 40. An $N_2$ gas supply source 44, a flow rate controller 45 and a valve V5 are installed in the $N_2$ gas supply line 43 in that order from an upstream side thereof. An upstream end of a bypass line 46 is connected between the $NH_3$ gas supply source 41 and the flow rate controller 42 in the $NH_3$ gas supply line 40. A downstream end of the bypass line 46 is connected to the gas exhaust line 15. A flow rate controller 47 and a valve V7 are installed in the bypass line 46 in that order from the upstream side thereof.

Next, the HF gas supply line 50 side (HF gas supply system) will be described. An HF gas supply source 51, a flow rate controller 52, and valves V4 and V2 are installed in the HF gas supply line 50 in that order from an upstream side thereof. A downstream end of an Ar gas supply line 53 for supplying a carrier gas (dilution gas) is connected between the valves V4 and V2 in the HF gas supply line 50. An Ar gas supply source 54, a flow rate controller 55 and a valve V6 are installed in the Ar gas supply line 53 in that order from an upstream side thereof. An upstream end of a bypass line 56 is connected between the HF gas supply source 51 and the flow rate controller 52 in the HF gas supply line 50. A downstream end of the bypass line 56 is connected to the gas exhaust line 15. A flow rate controller 57 and a valve V8 are installed in the bypass line 56 in that order from the upstream side thereof.

A heater 35 is provided to surround the gas supply lines 33 and 34, the dispersion space 32 and the diffusion plate 30. The dispersion space 32 and the diffusion plate 30 are set to, e.g., about 140° C.±10° C. The gas supply lines 33 and 34 are set to, e.g., about 75° C. Further, a heater (not shown) is provided in the processing chamber 1. An inner surface of the processing chamber 1 is set to, e.g., about 140° C.±10° C. Therefore, it is possible to control eduction of a by-product, e.g., $NH_4F$, generated by reaction between $NH_3$ gas and HF gas in the gas supply lines 33 and 34 or the like. Accordingly, generation of particles is suppressed.

The etching apparatus include a control unit 9. The control unit 9 is, e.g., a computer, including a program, a memory, and a CPU. The program has a group of steps for realizing a series of operations to be described later, so that opening/closing of the valves V1 to V8, flow rates of gases, a pressure in the processing chamber 1 and the like are controlled by the program. The program is stored in a computer storage medium, e.g., a flexible disk, a compact disk, a hard disk, a magneto-optical disk or the like, and installed in the control unit 9.

Figure 2:
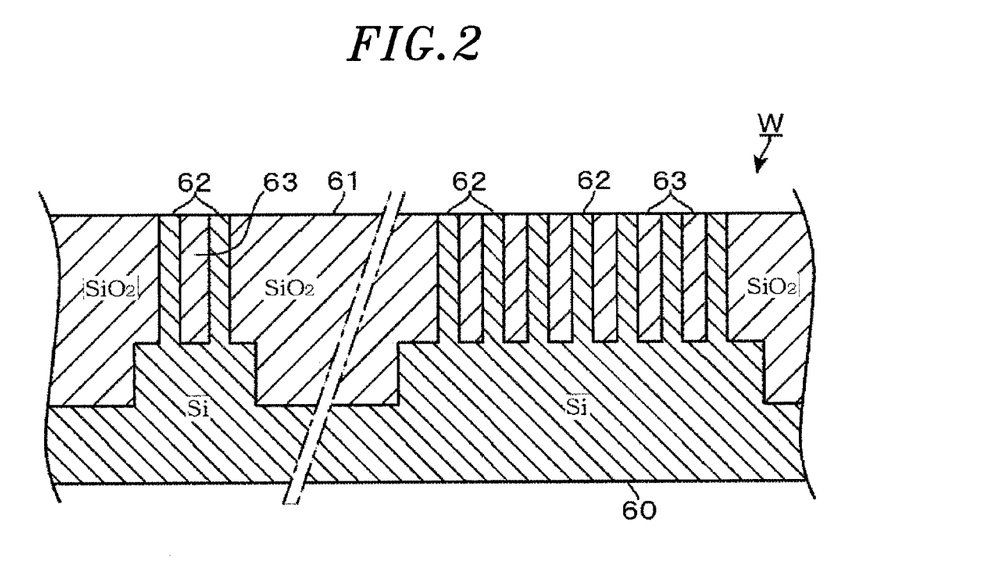
FIG. 2 is a vertical cross sectional view showing a vicinity of a surface of a wafer.
Figure 3:
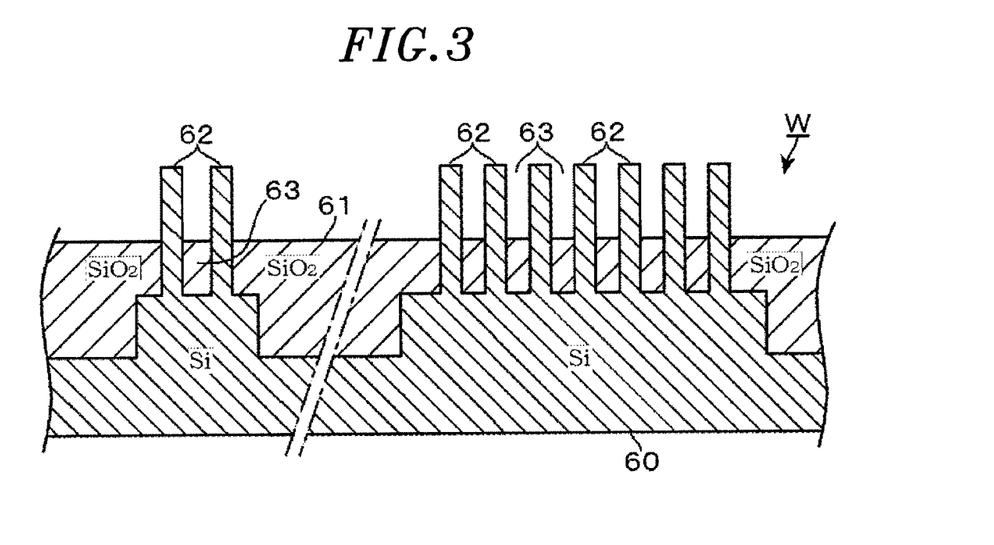
FIG. 3 is a vertical cross sectional view showing a vicinity of a surface of a wafer after an etching process.

Hereinafter, an operation of an embodiment of the disclosure will be described. First, there will be described an example of a surface structure of a wafer W as a target substrate to be loaded into the processing chamber 1. FIG. 2 shows a surface structure of the wafer W in the middle of a semiconductor device manufacturing process. FIG. 3 shows a surface structure of the wafer W after an etching process. In this surface structure, a plurality of walls 62 extending horizontally is formed in parallel by etching a Si (silicon) layer 60 and grooves 63 are formed between the walls 62. $SiO_2$ fills an area around the walls 62 which includes the grooves 63. If the area filled with $SiO_2$ is referred to as a $SiO_2$ layer 61, the surface of the $SiO_2$ layer 61 is leveled with the top surfaces of the Si walls 62. This surface structure may be explained in another way. In other words, protrusion patterns corresponding to pattern layers formed of the Si walls 62 are embedded in the $SiO_2$ layer 61 so that the surface of the $SiO_2$ layer 61 is located at the same vertical position as the top surfaces of the walls 62.

Since the $SiO_2$ layer 61 is a target to be etched by an etching apparatus, the $SiO_2$ layer 61 has an etching area partitioned by the protrusion patterns (walls) 62.

Figure 4:
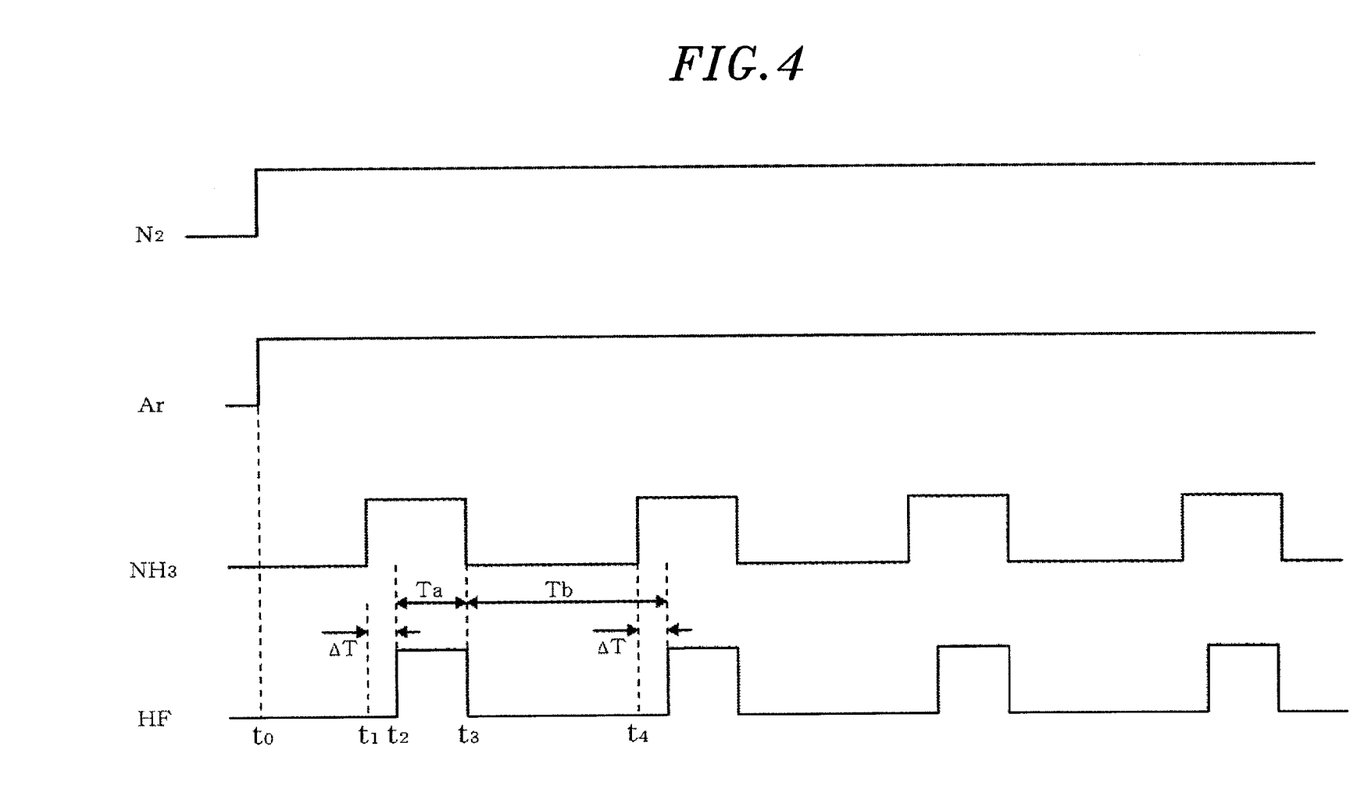
FIG. 4 explains gas supply transition in an embodiment.

The etching process of the $SiO_2$ layer 61 formed at the wafer W will be described with reference to FIG. 4 showing a time chart of supply (ON) and supply stop (OFF) of gases. The wafer W is mounted on the stage 2 by cooperation of an external transfer arm (not shown) and the upthrust pins 24 and heated to, e.g., about 115° C., by the heater 26. For example, the gas supply lines 33 and 34 are set to about 75° C. and a peripheral wall of the dispersion space 32 is set to about 130° C. by the heater 35 installed at the gas supply unit 3.

The gate valve 13 is closed and the processing chamber 1 is airtightly sealed. Then, at a time $t_0$ shown in FIG. 4, the valves V1 and V5 are opened and $N_2$ gas is supplied at a flow rate of, e.g., about 500 sccm. Further, the valves V2 and V6 are opened and Ar gas is supplied at a flow rate of, e.g., about 500 sccm. $N_2$ gas and Ar gas are dispersed in the dispersion space 32 and then supplied into the processing chamber 1 through the gas supply holes 31 formed at the diffusion plate 30.

Figure 5:
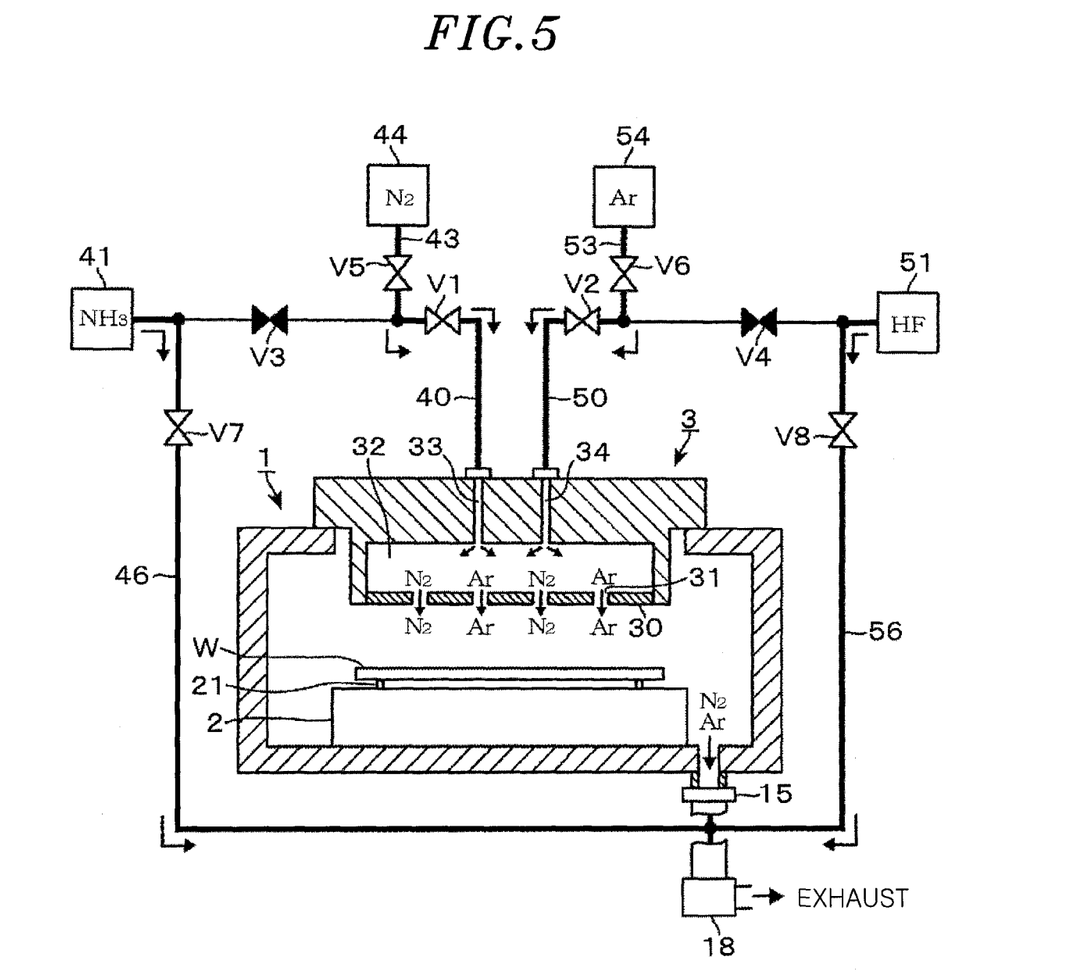
FIGS. 5 to 7 explain an operation of an embodiment.
Figure 6:
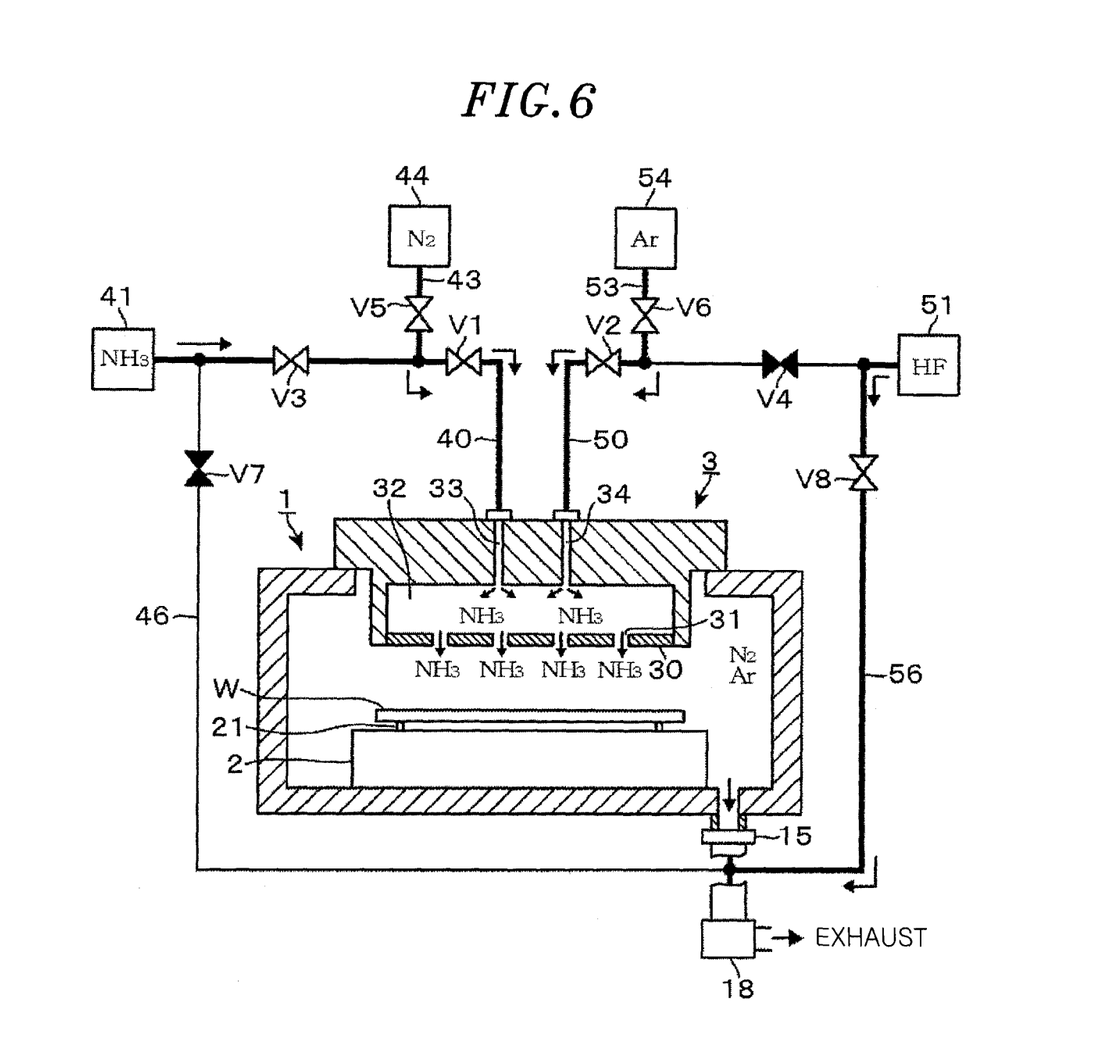

Next, a process of intermittently supplying HF gas and $NH_3$ gas to the wafer W is carried out. At a time $t_1$, $NH_3$ gas is ON. "ON" denotes supply of $NH_3$ gas from the gas supply unit 3 into the processing chamber 1. Specifically, at a time earlier than the time $t_1$, the valve V3 is closed and the valve V7 is opened as shown in FIG. 5, so that $NH_3$ gas bypasses the processing chamber 1 and flows toward the gas exhaust line 15 through the bypass line 46. After the flow rate becomes stable, the valve V3 is opened and the valve V7 is closed as shown in FIG. 6 at the time $t_1$. Accordingly, $NH_3$ gas is diluted with $N_2$ gas and flows into the dispersion space 32 through the gas supply line 33. Then, this gas is mixed with Ar gas supplied through the gas supply line 34. Next, this gas is injected to a processing atmosphere of the processing chamber 1 through the gas supply holes 31 and supplied to the wafer W. In FIG. 5 and the following drawings, closed valves are hatched for convenience of illustration.

Figure 7:
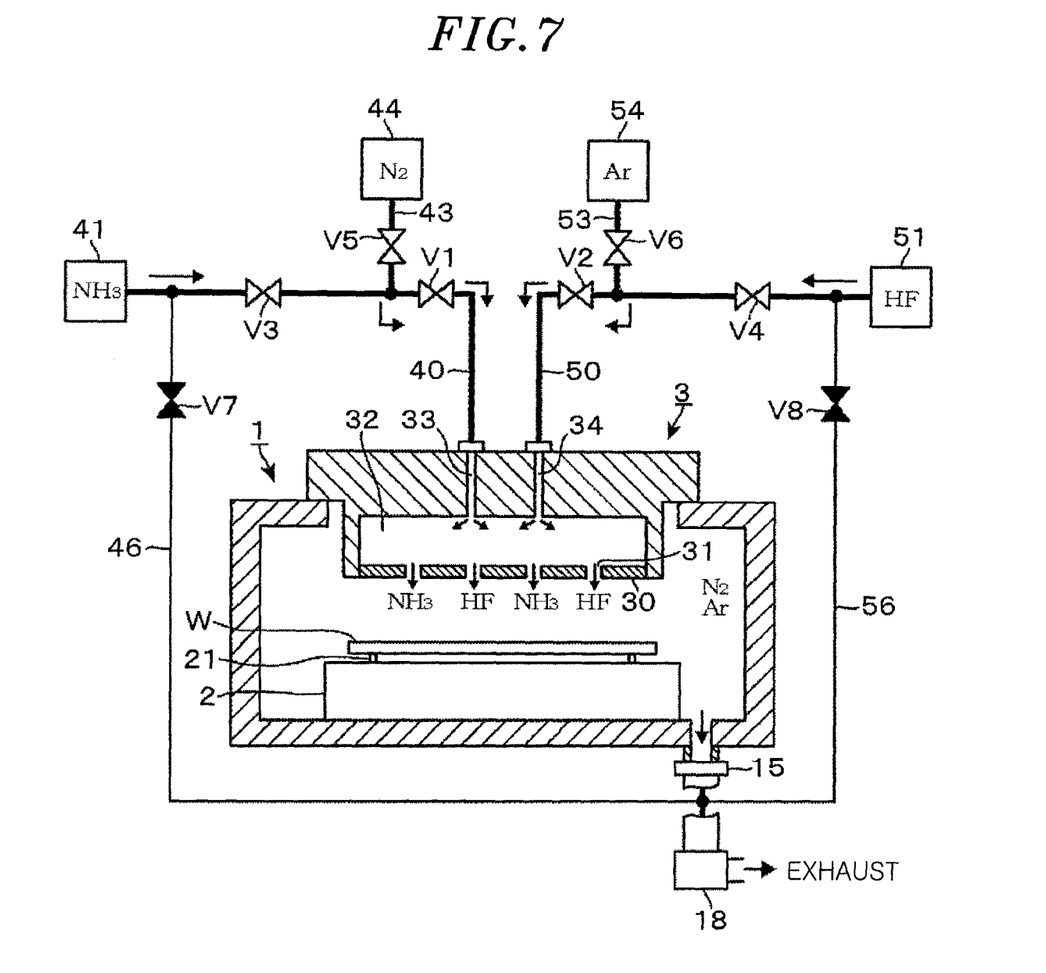

In the HF gas supply system, the valve V4 is closed and the valve V8 is opened as shown in FIG. 5 at a time earlier than the time $t_1$, so that HF gas bypasses the processing chamber 1 and flows toward the gas exhaust line 15 through the bypass line 56. After the flow rate becomes stable, the valve V4 is opened and the valve V8 is closed as shown in FIG. 7 at a time later than the time $t_1$ by $\Delta T$, i.e., at a time $t_2$ later than the time $t_1$ by, e.g., about 0.5 sec to 15 sec. Accordingly, HF gas is diluted with Ar gas and flows toward the dispersion space 32 through the gas supply line 34. As a consequence, $NH_3$ gas diluted with $N_2$ gas and HF gas diluted with Ar gas reach the dispersion space 32. The two gases are sufficiently mixed in the dispersion space 32, because the conductance is low due to a small diameter of the gas supply holes 31. The gaseous mixture is discharged to a processing atmosphere through the gas supply holes 31 and supplied to the wafer W.

At a time $t_3$ after the supply of the gaseous mixture for a period of time Ta, e.g., about 2 sec, the valves V3 and V4 are closed and the valves V7 and V8 are opened. Accordingly, the supply of $NH_3$ gas and HF gas is switched from the processing chamber 1 side to the bypass lines 46 and 56 side, and $NH_3$ gas and HF gas are OFF at the same time (the supply of both gases into the processing chamber 1 is stopped at the same time). Such a series of supply cycles are performed again after about 5 sec to 15 sec elapses from the time $t_3$. Then, the supply cycles are repeated a preset number of times. In this example, the supply of $NH_3$ gas into the processing chamber 1 is started at a time $t_4$ after about 5 sec to 15 sec elapses from the time $t_3$ and the supply of HF gas is started at a time later than the time $t_4$ by $\Delta T$ (after about 0.5 sec to 15 sec elapses from the time $t_4$). Therefore, the gaseous mixture of $NH_3$ gas and HF gas is supplied to the wafer W for the period of time Ta, e.g., about 2 sec. These supply cycles are performed multiple times at an interval of Tb, e.g., about 5 sec to 20 sec. $NH_3$ gas is supplied earlier than HF gas by $\Delta T$, e.g., about 0.5 sec to 15 sec. FIG. 4 is an image showing an example of a sequence for implementing the disclosure.

From the time $t_0$ to the completion of the supply cycles, a pressure in the processing chamber 1 is set to, e.g., about 250 Pa (1.88 Torr). Flow rates of $N_2$ gas and Ar gas are set to about 500 sccm. A flow rate of $NH_3$ gas is set to about 100 sccm. A flow rate of HF gas is set to about 200 sccm. After the supply cycles are repeated a preset number of times, $N_2$ gas and Ar gas are supplied into the processing chamber 1 and, then, the wafer W is unloaded from the processing chamber 1.

Figure 8:
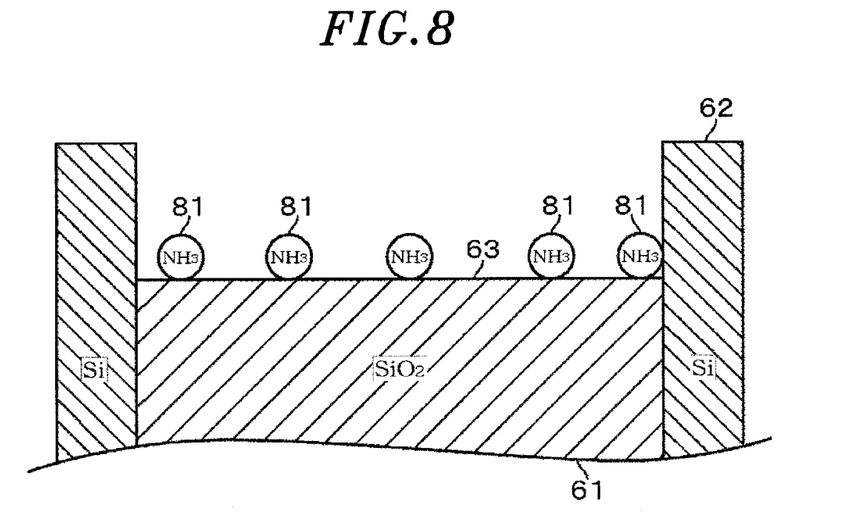
FIGS. 8 to 10 explain etching states on the wafer surface.
Figure 9:
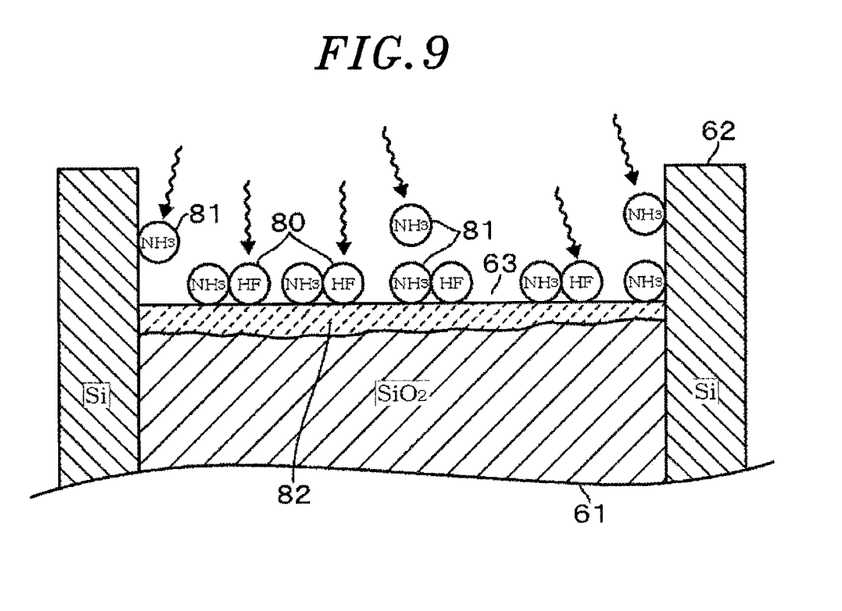
Figure 10:
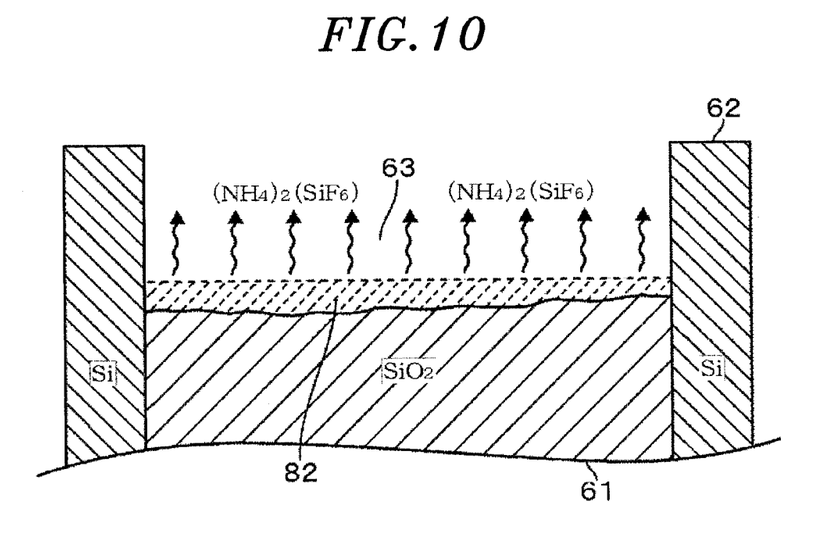

Hereinafter, there will be described the surface state of the wafer W during the above series of processes. FIGS. 8 to 10 are schematic diagrams (images) showing the surface state of the wafer W during the gas supply sequence shown in FIG. 4. These schematic views are images for intuitively recognizing the correspondence between the etching and the gas supply sequence, not accurately illustrating the surface state.

FIG. 8 shows a state in which $NH_3$ gas is supplied to the wafer W before HF gas is supplied to the wafer W. In this state, $NH_3$ molecules 81 are adsorbed onto the surface of the $SiO_2$ layer 61 (Although the entire surface of the $SiO_2$ layer 61 is actually covered with $NH_3$ molecules, its schematic state is illustrated in FIG. 8).

When the processing atmosphere is switched to the gaseous mixture of HF gas and $NH_3$ gas, the $SiO_2$ layer 61 reacts with HF molecules 80 and $NH_3$ molecules 81 as shown in FIG. 9, thereby generating a reaction by-product 82, e.g., $(NH_4)_2SiF_6$, water or the like. Next, the supply of $NH_3$ gas and HF gas is stopped and only $N_2$ gas and Ar gas flow as purge gases. Therefore, unreacted HF molecules 80 and unreacted $NH_3$ molecules 81 are removed by the purge gases. At this time, the reaction by-product 82 such as $(NH_4)_2SiF_6$, water and the like is volatilized (sublimated) by vacuum evacuation and removed by the purge gases as shown in FIG. 10. Accordingly, the $SiO_2$ layer is gradually removed by the sublimation of the reaction by-product 82.

In the above embodiment, $NH_3$ gas is firstly supplied and, then, HF gas is supplied. Although the etching occurs only by supplying HF gas to $SiO_2$, the reaction speed is increased by supplying $NH_3$ gas as well as HF gas, because $NH_3$ gas reacts as a catalyst ($NH_3$ gas is referred to as a catalyst even though $NH_3$ itself reacts). By adsorbing $NH_3$ gas onto the wafer W and then supplying the gaseous mixture of HF gas and $NH_3$ gas, HF gas and $NH_3$ gas easily react with the $SiO_2$ layer 61. As a result, the etching process becomes stable and rapidly proceeds.

The $SiO_2$ layer 61 is etched by the gaseous mixture. The reaction by-product 82 thus generated serves as an etching protective film. An exposed area of the $SiO_2$ layer 61 per unit area is smaller in a dense pattern area than in a sparse pattern area. Therefore, a thickness of the protective film adhered to the $SiO_2$ layer 61 is large and this leads to a decrease of the etching speed. Accordingly, in the case of performing an etching process by supplying HF gas and $NH_3$ gas consecutively, the microloading in which an etching speed becomes slower in the dense pattern area than in the sparse pattern area may occur. In the above-described embodiment, the supply of HF gas and $NH_3$ gas is stopped at an interval of 2 sec and the surface of the wafer W is purged by $N_2$ gas and Ar gas. As a consequence, the protective film is sublimated during the supply stop of HF gas and $NH_3$ gas. In other words, the surface state returns to an initial state. Therefore, the etching speed is not different between the dense pattern area and the sparse pattern area, and the microloading is avoided.

In the above-described embodiment, the supply of $NH_3$ gas and HF gas is stopped at the same time. Therefore, the reaction of the $SiO_2$ layer 61 with $NH_3$ gas and HF gas is stopped at the same time on the entire surface of the wafer W. When the supply of $NH_3$ gas is stopped and the supply of HF gas is continued, the etching process proceeds by HF gas. When the supply of HF gas is stopped and the supply of $NH_3$ gas is continued, $NH_3$ gas may react with HF gas remaining near the wafer W and this may result in over-etching. By stopping the supply of both gases at the same time, a difference from a desired etching amount is reduced and, thus, the etching accuracy can be increased.

The effect of suppressing the microloading can be further enhanced by pre-mixing HF gas and $NH_3$ gas. In the dense pattern area, the volume of the grooves 63 is small. Therefore, in the case of separately supplying HF gas and $NH_3$ gas, if one of the gases is firstly supplied, it is difficult to supply the other gas. Accordingly, it is expected that the reaction of the $SiO_2$ layer with HF gas and $NH_3$ gas becomes slower and the etching speed is decreased. By supplying HF gas and $NH_3$ gas in a pre-mixed state, HF gas and $NH_3$ gas are supplied in a uniformly mixed state to the grooves 63 even in the dense pattern area. As a result, the variation in the etching speed of the $SiO_2$ layer 61 filled in the grooves 63 is reduced regardless of the density of the pattern and the variation in the etching amount of the grooves 63 is reduced.

Further, in the case of separately providing HF gas and $NH_3$ gas into the processing chamber 1, an area where HF gas and $NH_3$ gas is non-uniformly mixed exists locally on the surface of the wafer W. In such an area, the etching speed is decreased. Therefore, when the $SiO_2$ layer 61 is etched, the etching speed varies even at the same groove 63. As a consequence, irregularities on the surface of the $SiO_2$ layer 61 are increased and the roughness becomes poor. The poor roughness can be avoided by supplying the gaseous mixture of HF gas and $NH_3$ gas to the wafer W.

In the above-described embodiment, the gaseous mixture of HF gas and $NH_3$ gas is intermittently supplied to the wafer W mounted on the processing chamber 1 of a vacuum atmosphere in the case of etching the $SiO_2$ layer 61 where an etching area is partitioned by the walls 62 and stopping the etching before a base layer is etched. When the gaseous mixture of HF gas and $NH_3$ gas is supplied to the heated wafer W, the gases react with $SiO_2$, thereby generating a reaction by-product. The etching process proceeds by the sublimation of the reaction by-product. The adhesion amount of the reaction by-product (protective film) varies depending on the density of the pattern. In the method of the present embodiment, the reaction by-product is sublimated (volatilized) by the heating of the substrate during the supply stop of the processing gas, so that the etching speed is constant regardless of the density of the pattern. Accordingly, the microloading is suppressed. Further, since HF gas and $NH_3$ gas are supplied in a pre-mixed state to the target substrate from the gas supply unit, the surface roughness is improved and the microloading can be further suppressed as described above.

Figure 11:
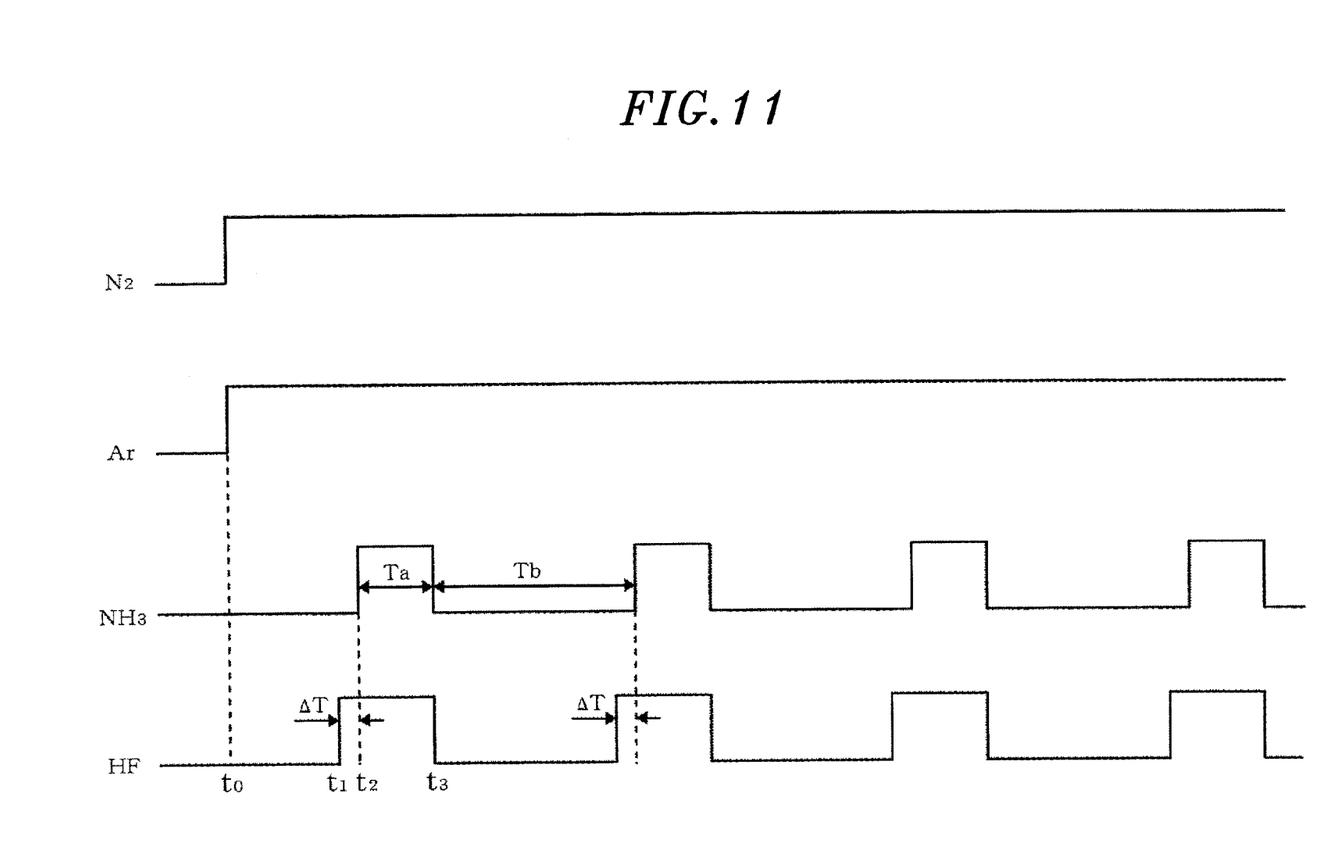
FIG. 11 explains gas supply transition in another embodiment.

In the disclosure, as can be seen from the time chart of FIG. 11, the gaseous mixture of $NH_3$ gas and HF gas may be supplied in a pulsed manner by supplying HF gas into the processing chamber 1 at the time $t_1$, supplying $NH_3$ gas at the time $t_2$, and stopping the supply of HF gas and $NH_3$ gas at the same time at the time $t_3$. The supply time Ta of the gaseous mixture is set to, e.g., about 2 sec. The supply stop time Tb of the gaseous mixture is set to about 5 sec.

In the above-described embodiment, when the supply of HF gas to the wafer W is stopped, HF gas flows toward the bypass line 56. In the case of stopping the flow of the carrier gas to a hydrofluoric acid solution tank as an HF gas supply source during the supply stop, the method of FIG. 11 is effective in stabilizing volatilization of hydrofluoric acid. Therefore, it is preferable to select a gas to be supplied first between HF gas and $NH_3$ gas depending on semiconductor device manufacturing processes.

In the case of employing the sequence shown in FIG. 4 or 11, one of HF gas and $NH_3$ gas is supplied earlier than the other gas by $\Delta T$, e.g., about 0.5 sec to 15 sec. The time Ta at which the gaseous mixture of both gases is supplied preferably has a duration of, e.g., about 0.5 sec to 5 sec. The supply stop time Tb of the gaseous mixture preferably has a duration of, e.g., about 5 sec to 20 sec.

In this disclosure, HF gas may be intermittently supplied multiple times while continuously supplying $NH_3$ gas into the processing chamber 1. Or, $NH_3$ gas may be intermittently supplied multiple times while continuously supplying HF gas.

Moreover, in this disclosure, HF gas and $NH_3$ gas may be supplied into the processing chamber 1 at the same time in a pulsed manner. In that case, the gas supply and the supply stop are controlled by controlling opening/closing of the valves V3, V4, V7 and V8. When the gas supply is stopped, HF gas and $NH_3$ gas bypass the processing chamber 1 through the bypass lines 56 and 46, respectively, to be exhausted. In such a process, a period of time in which the wafer W is exposed to an atmosphere of the processing gas containing a mixture of HF gas and $NH_3$ gas and a period of time in which the wafer W is not exposed to any one of HF gas and $NH_3$ gas are alternately repeated multiple times. Accordingly, the concentration difference of each of HF gas and $NH_3$ gas on the surface of the wafer W is reduced. As a result, the $SiO_2$ layer 61 can be uniformly etched.

A diffusion member for diffusing gases radially in a horizontal direction may be provided at downstream sides of the gas supply lines 33 and 34. HF gas and $NH_3$ gas may be dispersed in the dispersion space 32 and mixed with each other.

Figure 12:
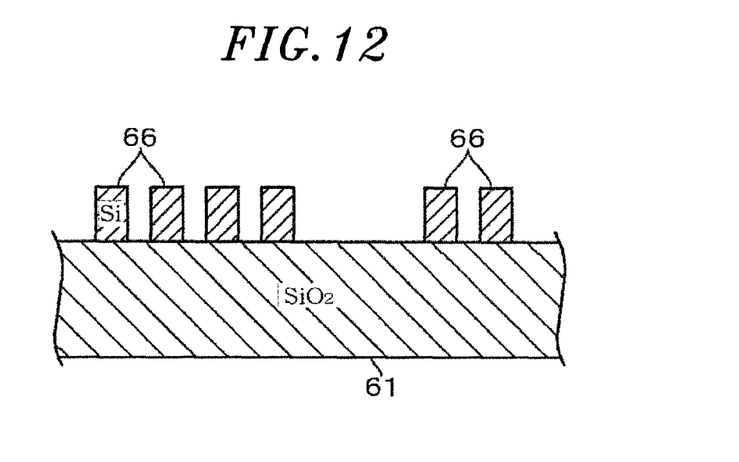
FIG. 12 is a vertical cross sectional view showing a vicinity of a wafer surface in another embodiment.

As an example of the silicon oxide layer on the target substrate where the etching area is partitioned by the pattern layers, the $SiO_2$ layer 61 having on a top surface thereof Si mask patterns 66 as shown in FIG. 12 may be used. In that case, the $SiO_2$ layer 61 is etched along the mask patterns 66 and the etching is stopped before a base layer is etched.

The $SiO_2$ layer 61 can be etched by using a processing gas containing nitrogen, hydrogen and fluorine, such as ammonium fluoride ($NH_4F$) gas. In that case, the gas reacts with the $SiO_2$ layer 61, thereby generating $(NH_4)_2SiF_6$. Therefore, it is possible to suppress the microloading and improve the surface roughness of the $SiO_2$ layer 61 by intermittently supplying ammonium fluoride ($NH_4F$) gas multiple times to the wafer W having the $SiO_2$ layer 61.

In other words, the disclosure is a method of intermittently exposing a target substrate to a processing gas containing a gaseous mixture of $NH_3$ gas and HF gas or a processing gas containing a compound of nitrogen, hydrogen and fluorine, such as $NH_4F$ gas or $NH_4FHF$ gas, multiple times. The processing gas may be a gaseous mixture of $NH_3$ gas, HF gas and $NH_4F$ gas (or $NH_4FHF$ gas).

(Test Example)

Figure 13:
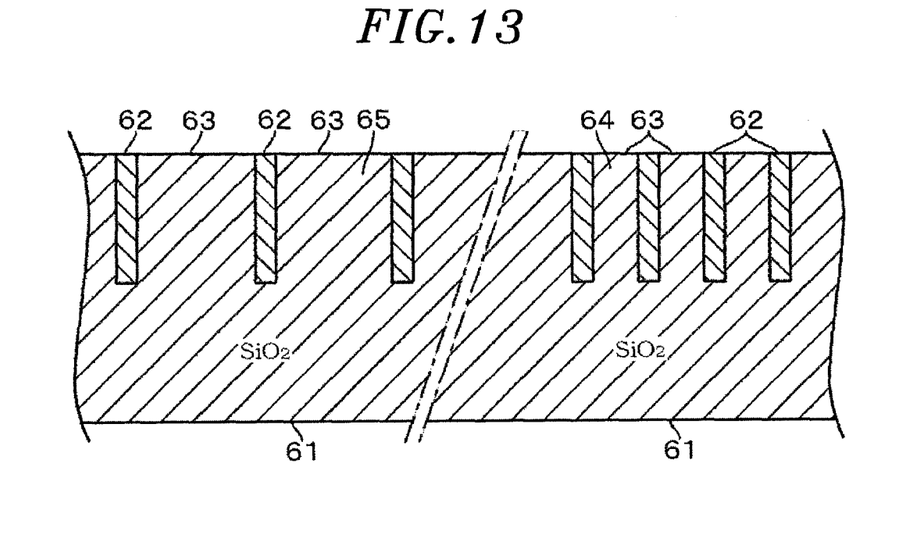
FIG. 13 is a cross sectional view of a wafer after an etching process in a test example and a comparative example.

In order to examine the effect of the disclosure, the uniformity of the surface was evaluated by performing an etching process on the wafer W. As shown in FIG. 13, the wafer W has an area where the Si walls 62 extending horizontally are formed in parallel in the $SiO_2$ layer 61. Such an area includes an area 64 where the walls 62 are spaced from each other by a gap of about 30 nm and an area 65 where the walls 62 are spaced from each other by a gap of about 90 nm. In the $SiO_2$ layer 61 as an etching target, the area 64 where the gap between the walls 62 is small (30 nm) corresponds to the area 64 where the pattern for partitioning the etching area is dense, and the area 65 where the gap between the walls 62 is large (90 nm) corresponds to the area 65 where the pattern for partitioning the etching area is sparse. In the test example, the etching process was performed on the wafer W by using the apparatus shown in FIG. 1 by the sequence of FIG. 4. As described above, the periods of time Ta, Tb, and $\Delta T$ were 2 sec, 15 sec and 10 sec, respectively. The supply cycles were repeated 12 times. In a comparative example, an etching process was performed on the wafer W for evaluation by the same sequence as that in the test example by using a post-mix type apparatus for separately supplying HF gas and $NH_3$ gas into the processing chamber 1 through the gas supply holes 31 of the gas supply unit 3, instead of a pre-mix type apparatus shown in FIG. 1.

Figure 14:
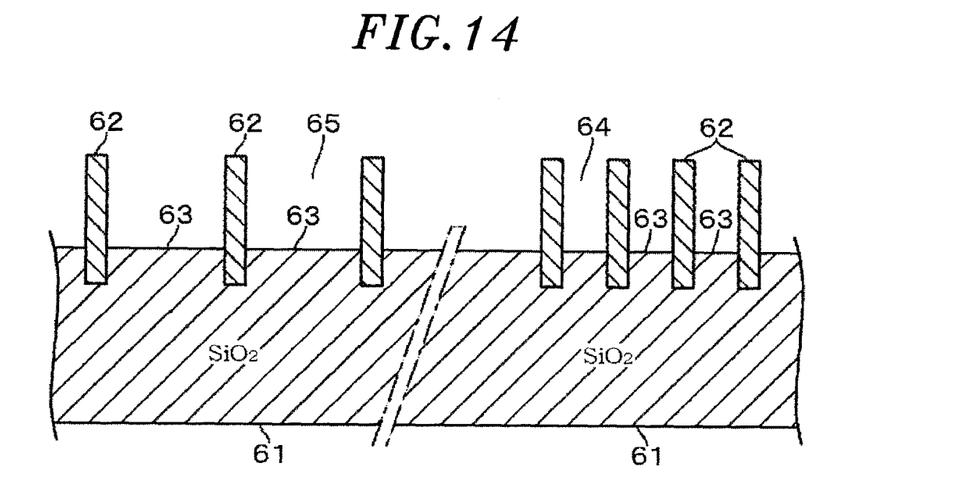
FIG. 14 is a cross sectional view of the wafer after the etching process in the test example.
Figure 15:
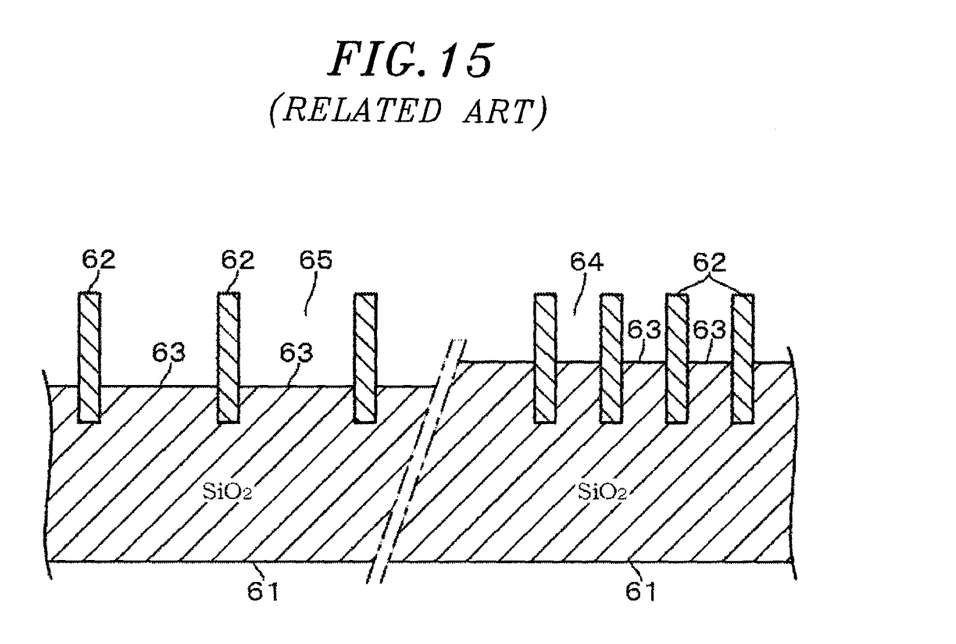
FIG. 15 is a cross sectional view of the wafer after the etching process in the comparative example.
Figure 16:
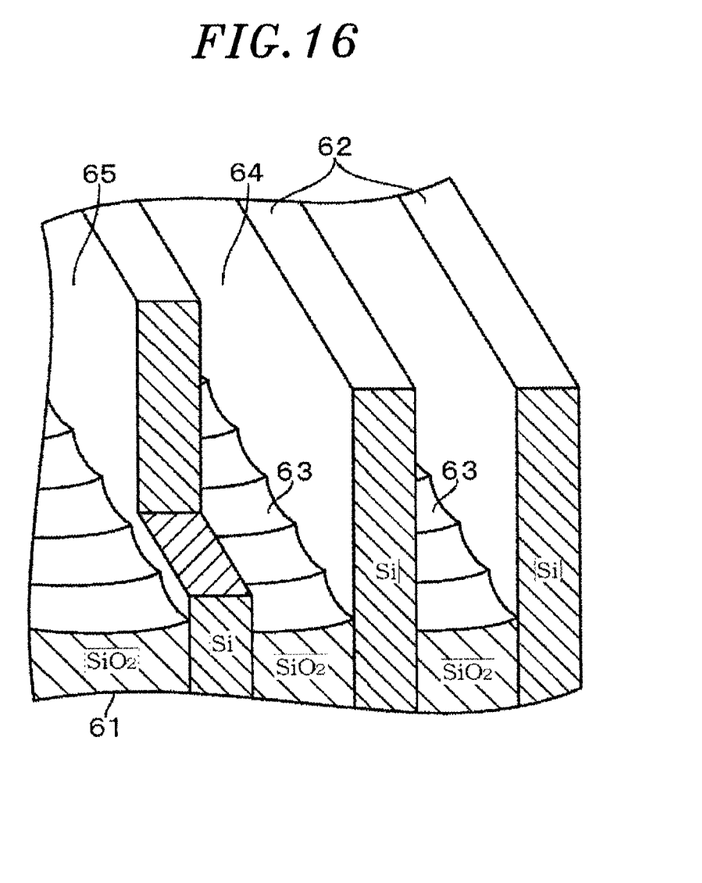
FIG. 16 is a perspective view showing a wafer surface state in the test example.
Figure 17:
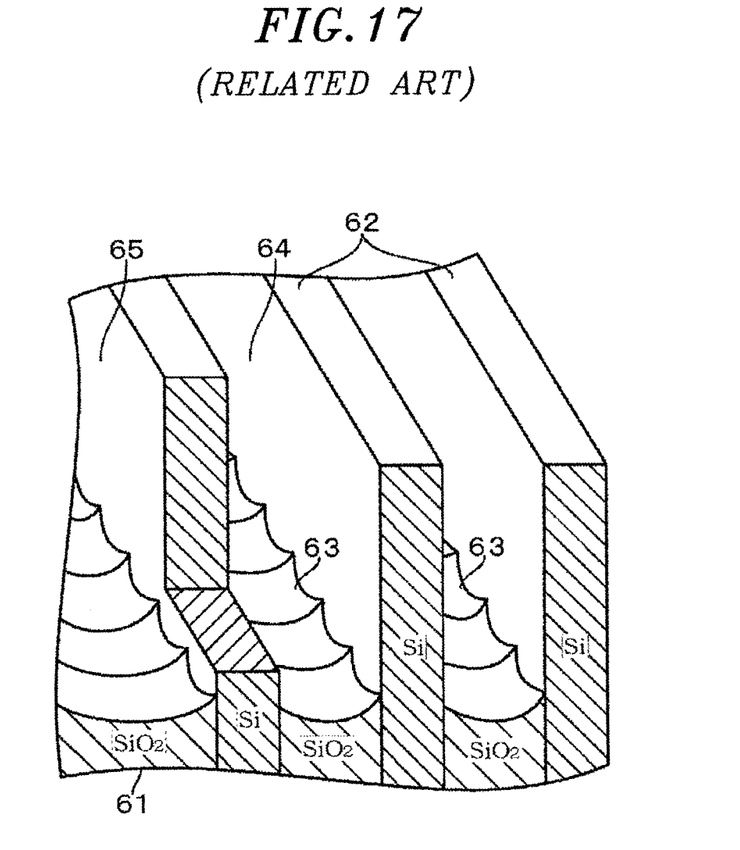
FIG. 17 is a perspective view showing a wafer surface state in the comparative example.

FIG. 14 is a cross sectional view of the wafer W after the etching process of the test example. FIG. 15 is a cross sectional view of the wafer W after the etching process of the comparative example. These cross sectional views are obtained from results of monitoring SEM (scanning electron microscope) images. FIG. 16 shows a surface roughness state of the wafer W after the etching process of the test example. FIG. 17 shows a surface roughness state of the wafer W after the etching process of the comparative example. In the test example, the vertical position of the surface of the $SiO_2$ layer 61 is substantially the same between the dense pattern area 64 and the sparse pattern area 65 as shown in FIG. 14. A difference between an average etched depth in the dense pattern area 64 and an average etched depth in the sparse pattern area 65 is about 1 nm or less, which is close to zero. In the comparative example, a etched depth in the dense pattern area 64 is smaller than that in the sparse pattern area 65 as shown in FIG. 15 and a difference between an average etched depth in the dense pattern area 64 and an average etched depth in the sparse pattern area 65 is greater than about 10 nm.

In the comparative example, bottom portions of the grooves 63 are etched in a waveform as shown in FIG. 17. However, in the test example shown in FIG. 16, a etcheded amount is smaller and a flatness is higher than those in the comparative example. Therefore, the test example shows that the method of the disclosure can suppress the microloading and improve the surface roughness of the $SiO_2$ layer 61.

While the disclosure has been shown and described with respect to the embodiments, it will be understood by those skilled in the art that various changes and modifications may be made without departing from the scope of the disclosure as defined in the following claims.

What is claimed is:

1. A method for etching a silicon oxide film on a target substrate where an etching area is partitioned by a pattern layer and stopping the etching before a base layer of the silicon oxide film is exposed, the method comprising:
   heating the target substrate in a vacuum atmosphere;
   starting a supply of an ammonia gas to the silicon oxide film for ammonia molecules to be adsorbed onto a surface of the silicon oxide film;
   starting a supply of a hydrogen fluoride gas at a lapse of a first time period after said starting of the supply of the ammonia gas, thereby supplying a gaseous mixture of the ammonia gas and the hydrogen fluoride gas to the silicon oxide film during a second time period; and
   stopping said supply of the ammonia gas and said supply of the hydrogen fluoride gas at the same time, thereby stopping said supplying the gaseous mixture during a third time period,
   wherein said starting the supply of the ammonia gas, said supplying the gaseous mixture and said stopping supplying the gaseous mixture are repeated multiple times, and
   wherein the first time period is about 0.5 sec to 15 sec of said supply of the ammonia gas.

2. The method of claim 1, wherein the second time period is about 0.5 sec to 5 sec.

3. The method of claim 1, wherein the third time period is about 5 sec to 20 sec.

4. The method of claim 2, wherein the third time period is about 5 sec to 20 sec.

5. The method of claim 1, wherein in the starting of the supply of the ammonia gas, the ammonia gas is supplied to the silicon oxide film through a dispersion space and a diffusion plate having a plurality of gas supply holes, and wherein, in the starting the supply of the hydrogen fluoride gas, the hydrogen fluoride gas is supplied through the dispersion space such that the gaseous mixture is mixed in the dispersion space and then supplied through the diffusion plate to the silicon oxide film.

\* \* \* \* \*